(12) United States Patent
Ho et al.

(10) Patent No.: US 8,092,621 B2
(45) Date of Patent: Jan. 10, 2012

(54) METHOD FOR INHIBITING GROWTH OF NICKEL-COPPER-TIN INTERMETALLIC LAYER IN SOLDER JOINTS

(75) Inventors: Cheng-En Ho, Taipei County (TW); Chi-Ming Lin, Taipei (TW)

(73) Assignee: Yuan Ze University, Taoyuan County (TW)

( * ) Notice: Subject to any disclaimer, the term of this patent is extended or adjusted under 35 U.S.C. 154(b) by 31 days.

(21) Appl. No.: 12/776,607

(22) Filed: May 10, 2010

(65) Prior Publication Data

US 2011/0139314 A1    Jun. 16, 2011

(30) Foreign Application Priority Data

Dec. 15, 2009 (TW) .............................. 98142973 A

(51) Int. Cl.
*B23K 38/28* (2006.01)
*B23K 31/02* (2006.01)

(52) U.S. Cl. .................................. 148/528; 228/180.22

(58) Field of Classification Search .................. 148/528; 228/180.22

See application file for complete search history.

(56) References Cited

U.S. PATENT DOCUMENTS

2008/0308297 A1 * 12/2008 Jurenka et al. ............. 174/126.2

* cited by examiner

*Primary Examiner* — Jessee R. Roe
(74) *Attorney, Agent, or Firm* — J.C. Patents

(57) ABSTRACT

A method for inhibiting the growth of a nickel-copper-tin intermetallic (i.e. $(Ni,Cu)_3Sn_4$) layer at the $(Cu,Ni)_6Sn_5$/nickel interface of a solder joint is described as follows. A Sn—Ag—Cu solder alloy with a Cu-content of 0.5~1 weight percent (wt. %) is provided. The solder alloy is disposed on a surface finish of a soldering pad, having a nickel-based metallization layer. A material of the solder alloy further includes palladium. The solder alloy is joined with the surface finish, so as to form the solder joint containing palladium that enables to inhibit the growth of the undesired $(Ni,Cu)_3Sn_4$ layer between the $(Cu,Ni)_6Sn_5$ and nickel in the subsequent use at temperatures ranging from 100° C. to 180° C.

4 Claims, 2 Drawing Sheets

METHOD FOR INHIBITING GROWTH OF NICKEL-COPPER-TIN INTERMETALLIC LAYER IN SOLDER JOINTS

CROSS-REFERENCE TO RELATED APPLICATION

This application claims the priority benefit of Taiwan application serial no. 98142973, filed Dec. 15, 2009. The entirety of the above-mentioned patent application is hereby incorporated by reference herein and made a part of specification.

BACKGROUND OF INVENTION

1. Field of Invention

The invention relates to a method for inhibiting the growth of a nickel-copper-tin intermetallic (i.e. $(Ni,Cu)_3Sn_4$) layer at the $(Cu,Ni)_6Sn_5$/nickel interface of a solder joint. More particularly, the invention relates to a method for inhibiting the growth of a $(Ni,Cu)_3Sn_4$ layer at the interface of the $(Cu,Ni)_6Sn_5$/nickel by adding palladium into solder joints.

2. Description of Related Art

Soldering is a very common process utilized in modern microelectronic packages, such as assembling IC (integrated circuit) devices to printed circuit boards (PCBs) or those to chip carrier substrates. This is primarily attributed to such process is a very efficient, low cost, and high reliable method in connecting components electrically. During soldering, a solder alloy melts and reacts with the soldering pads (possibly coated with surface finishes) of two opposite components to form a solder joint. These solder joints serve not only to provide signal and electric energy communication among devices of a component but also to achieve a mechanical support among components. The state-of-the-art array-array packages can have solder joints count as high as about five thousands. However, solder joints are realized to be the weakest link for the entire electronic product, especially for the region that the solder alloy contacts with the soldering pad(s), i.e. the solder/pad interface. Failure in any joint (or the solder/pad interface) will make the whole package un-operational. In consequence, to advance the mechanical properties of solder joints becomes one of the most important issues to improve the overall reliability of one electronic product.

When a solder alloy and a soldering pad come in contact, the interfacial reaction between them produces an intermetallic compound (IMC) layer(s) on the contact region (referred to as "the interface of a solder joint" hereinafter). The status of the IMC layer(s) growth plays a predominant role in determining the reliability of a solder joint. If the IMC layer is not formed at the interface of a solder joint, the solderability between the solder and the soldering pad will be very poor, leading to an open circuit easily. Conversely, if the intermetallic layer is too thick, it deteriorates the mechanical characteristic of the interface due to the brittle nature of all the known intermetallics.

According to the related art, the soldering pads are usually treated with surface finish in order to prevent oxidation of a soldering pad and to enhance the bonding reliability with a solder alloy. The Ni-based metallization surface finish, such as electroless nickel and immersion gold (ENIG) plating process, is one of the most common metallization techniques utilized in the related art when conducting surface finish. This is primarily based on the fact that the surface gold layer is an excellent oxidation resistance and the underlying nickel layer (or Ni—P alloy) is a good diffusion barrier that prevents an excessive IMC growth at the interface of a solder joint. By applying the ENIG process, the soldering pads are coated with a bi-layer structure of Au/Ni(P) accordingly.

Additionally, in response to recent enhancement of environmental protection consciousness, lead-free soldering has been extensively used in the microelectronic industry. A tin-silver-copper (Sn—Ag—Cu) family alloy is the mainstream solder alloy adopted to the lead-free soldering process in recent years. The joint microstructure of applying Sn—Ag—Cu alloy to a nickel-containing pad is described hereinafter.

FIG. 1 is a schematic drawing showing the cross-sectional view of a conventional solder joint which is a lead-free, Sn—Ag—Cu solder joint. In FIG. 1, when a solder alloy 110 (made of a Sn—Ag—Cu alloy) and a surface finish 120 (e.g. the Au/Ni bi-layer structure) are soldered, a copper-tin-nickel intermetallic layer (i.e. $(Cu,Ni)_6Sn_5$) 130 is formed at the interface of a solder joint. After a long-term use of the solder joints in the normal life, one additional nickel-copper-tin intermetallic layer (i.e. $(Ni,Cu)_3Sn_4$) 140 is formed between the copper-tin-nickel intermetallic layer 130 and the surface finish 120, causing the interface embrittlement. The formation of the aforesaid structure would severely deteriorate the mechanical strength of the interface, thus jeopardizing lifespan of the electronic product.

SUMMARY OF INVENTION

The invention is directed to a method for inhibiting the growth of the $(Ni,Cu)_3Sn_4$ layer at the $(Cu,Ni)_6Sn_5$/nickel interface of a solder joint. The interfacial shear strength of solder joints can be enhanced significantly through applying the method.

In the invention, a method for inhibiting the growth of the undesired $(Ni,Cu)_3Sn_4$ layer at the interface is described below. A Sn—Ag—Cu solder alloy is provided. The solder alloy is disposed on a surface finish of a soldering pad. Here, a material of the surface finish includes nickel. A material of at least one of the solder alloy and the surface finish further includes palladium. During soldering, the solder alloy reacts with the surface finish, so as to form a solder joint containing palladium, and a $(Cu,Ni)_6Sn_5$ intermetallic layer at the interface of the solder joint. When a solder joint containing palladium is aged at temperatures ranging from 100° C. to 180° C., the undesired $(Ni,Cu)_3Sn_4$ layer can be inhibited to grow between $(Cu,Ni)_6Sn_5$ and nickel.

According to an embodiment of the invention, the solder alloy or the surface finish of the solder joint contains approximately 0.05~0.12 weight percent palladium.

According to an embodiment of the invention, the Sn—Ag—Cu alloy has a composition of 0.5~1 weight percent copper, 0~4 weight percent silver, and a balance of tin.

According to an embodiment of the invention, the solder joint contains a $(Cu,Ni)_6Sn_5$ intermetallic layer at the interface.

According to an embodiment of the invention, the material of the surface finish includes pure nickel or a nickel-based alloy.

Based on the above, by adding palladium into solder joints, the growth of the $(Ni,Cu)_3Sn_4$ layer between $(Cu,Ni)_6Sn_5$ and nickel is prohibited in this invention, and the interfacial shear strength of the solder joints can be further enhanced.

It is to be understood that both the foregoing general descriptions and the detailed embodiments are exemplary and are, together with the accompanying drawings, intended to provide further explanation of technical features and advantages of the invention.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
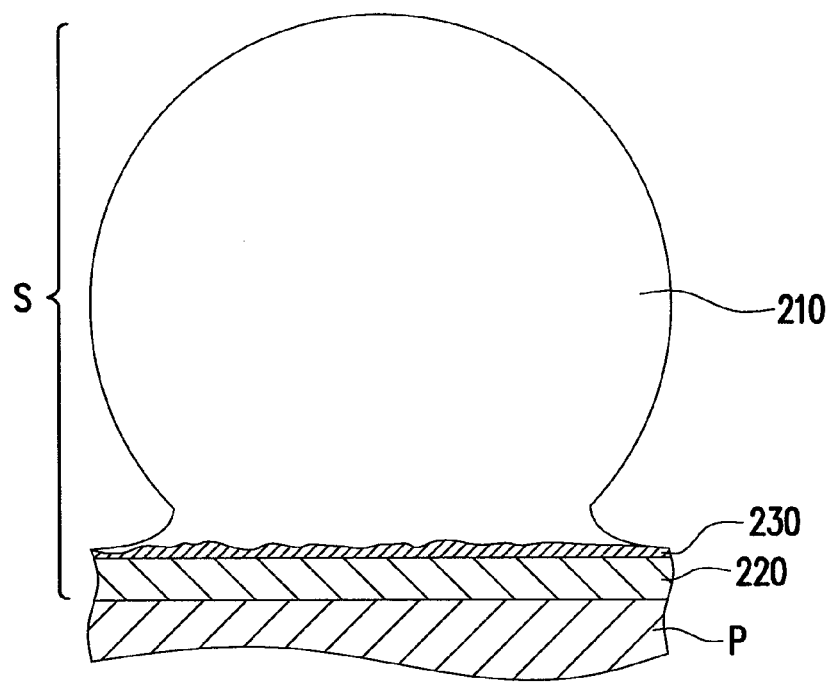
FIG. 2 is a schematic drawing showing the cross-sectional view of a solder joint that was fabricated according to an embodiment of the invention.

FIG. 2 is a schematic drawing showing the cross-sectional view of a solder joint that was fabricated according to an embodiment of the invention. In FIG. 2, a solder alloy 210 is provided, and the material of the solder alloy 210 is made of Sn—Ag—Cu. In the Sn—Ag—Cu solder alloy 210, a weight percent of Sn in the Sn—Ag—Cu solder alloy is X, a weight percent of Ag in the Sn—Ag—Cu solder alloy is Y and a weight percent of Cu in the Sn—Ag—Cu solder alloy is Z, where $X=100-(Y+Z)$, $Y=0\sim4$, $Z=0.5\sim1$.

The solder alloy 210 is disposed on a surface finish 220 wherein a material of surface finish 220 includes pure nickel or a nickel-based alloy. The surface finish 220 can be a bi-layer structure of the Au/Ni (for example) disposed on a soldering pad P. The material of the soldering pad P is usually made of copper or a copper alloy in realistic applications.

Note that a material of at least one of the solder alloy 210 and the surface finish 220 further includes palladium. Specifically, in this embodiment, either the solder alloy 210 or the surface finish 220 includes palladium, such that the resulting solder joint includes palladium.

Figure 1:
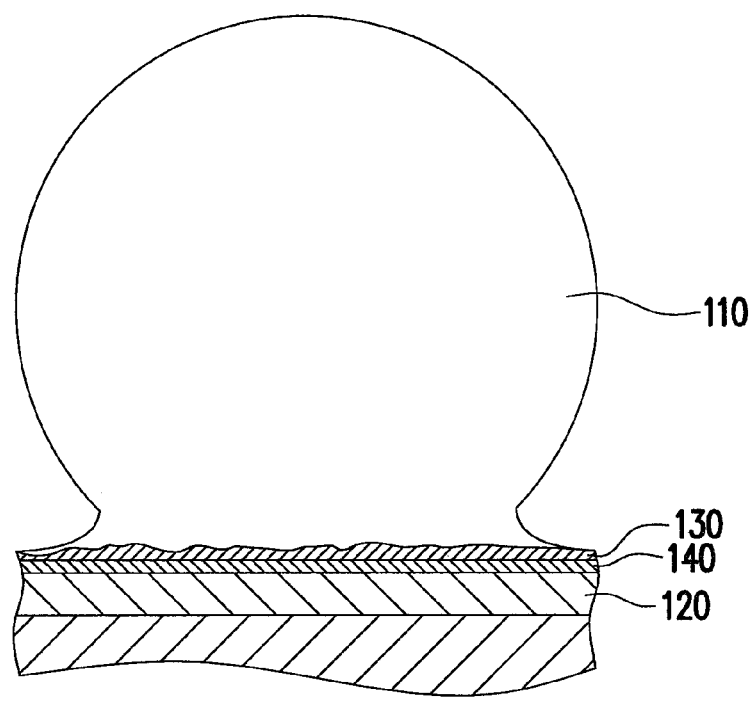
FIG. 1 is a schematic drawing showing the cross-sectional view of a conventional solder joint.

The solder alloy 210 is soldered to the surface finish 220 to form a solder joint S. The solder joint S contains palladium, and the palladium in the solder joint S enables to prohibit the growth of the $(Ni,Cu)_3Sn_4$ layer 140 (as shown in FIG. 1) at the interface.

In particular, the palladium in the solder joint S originates from either the solder alloy 210 or the surface finish 220, and the solder alloy 210 of the solder joint S contains approximately 0.05~0.12 weight percent palladium (relative to the total weight of the solder alloy 210). Besides, when the solder alloy 210 has a copper content equal to or over 0.5 weight percent (before soldering), a copper-nickel-tin intermetallic layer (i.e. $(Cu,Ni)_6Sn_5$) 230 can grow between the solder alloy 210 and the surface finish 220.

Figure 3:
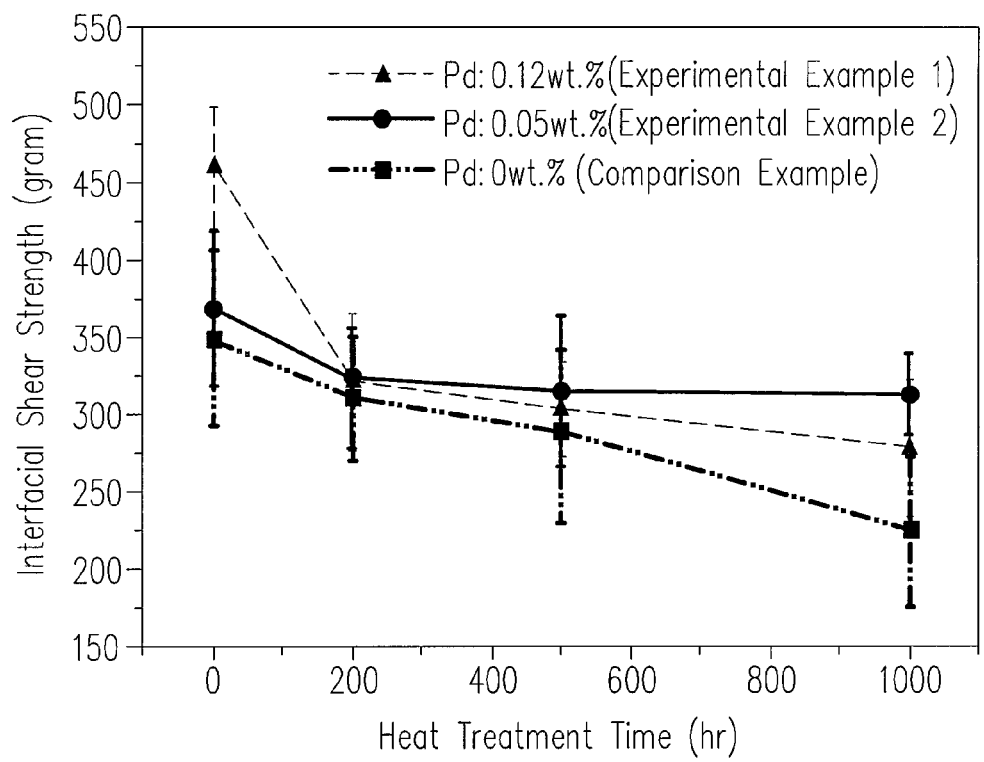
FIG. 3 is the result of the interfacial shear strength of solder joints as a function of heat treatment time at 180° C. A comparison of the baseline solder joints (without doping palladium) to two sets of solder joints (with doping various palladium contents, 0.05 and 0.12 weight percent respectively) is available in this figure.

FIG. 3 is the result of the interfacial shear strength of solder joints varied with the heat treatment time at 180° C. A comparison of the baseline solder joints (without doping palladium) to two sets of solder joints (with doping various palladium contents, 0.05 and 0.12 weight percent respectively) is depicted in this figure. The interfacial shear strength of solder joints was measured using a conventional bond tester according to the JESD22-B117 standard. The diameter of the solder alloy (110 and 210) used in these three cases (palladium content: 0, 0.05, and 0.12 weight percent) is fixed at 300 μm (before soldering), and the surface finish (120 and 220) is primarily a nickel-based metallization after soldering, such as an electro- or electroless-plating nickel. Heat treatment applied to solder joints was carried out in a conventional oven setup at 180° C. In other embodiment, the heat treatment temperature can range from 100° C. to 180° C.

As shown in FIG. 3, the interfacial shear strength of solder joints dramatically decreased after a 200-hours heat treatment in the three cases (palladium content: 0, 0.05, and 0.12 weight percent). However, when the heat treatment is further prolonged for over 200 hours, the interfacial shear strength of the palladium-containing solder joints quickly levels off. By contrast, the interfacial shear strength of the palladium-free solder joints keeps decreasing, especially after 500 hours of the heat treatment. This is attributed to a significant growth of the $(Ni,Cu)_3Sn_4$ layer 140 (as shown in FIG. 1) at the interface, causing a brittle interface that deteriorates the interfacial mechanical properties of solder joints. On the other hand, the formation of the undesired $(Ni,Cu)_3Sn_4$ layer 140 can be prohibited with adoption of the palladium to the solder joints, thereby avoiding the presence of the $(Ni,Cu)_3Sn_4$ layer at the interface, improving the reliability of solder joints, and extending lifespan of electronic products in which the solder joint of the invention is used.

In light of the foregoing, with adoption of palladium to solder joints, the formation of the undesired $(Ni,Cu)_3Sn_4$ layer 140 is prohibited in this invention, and the resulting interfacial shear strength can be enhanced significantly, so as to advance the reliability of solder joints. Since the amount of palladium involved is small, the properties and the processing conditions for manufacturing solder joints will not been altered substantially. As a consequence, the method of the invention is compatible with the conventional soldering process.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for inhibiting the growth of a $(Ni,Cu)_3Sn_4$ layer at the $(Cu,Ni)_6Sn_5$/nickel interface of a solder joint, comprising:

providing a Sn—Ag—Cu solder alloy; and disposing the solder alloy on a surface finish of a soldering pad, wherein a material of the surface finish comprises nickel, and a material of the solder alloy further comprises palladium; and soldering the solder alloy to the surface finish to form a solder joint, wherein a $(Cu,Ni)_6Sn_5$ intermetallic layer forms at the solder alloy/nickel interface of the solder joint; and aging the solder joint at temperatures ranging from 100° C. to 180° C., the undesired $(Ni,Cu)_3Sn_4$ layer can be inhibited to grow between $(Cu,Ni)_6Sn_5$ and nickel.

2. The method as claimed in claim 1, wherein a weight percent of Sn in the Sn—Ag—Cu solder alloy is X, a weight percent of Ag in the Sn—Ag—Cu solder alloy is Y and a weight percent of Cu in the Sn—Ag—Cu solder alloy is Z, where $X=100-(Y+Z)$, $Y=0\sim4$, $Z=0.5\sim1$.

3. The method as claimed in claim 1, wherein the material of the surface finish comprises pure nickel or a nickel-based alloy.

4. The method as claimed in claim 1, wherein the solder alloy further contains approximately 0.05~0.12 wt. % palladium.

* * * * *